United States Patent
Chen et al.

(10) Patent No.: US 11,035,899 B2
(45) Date of Patent: Jun. 15, 2021

(54) SYSTEM FOR DETECTION OF PASSIVE VOLTAGE CONTRAST

(71) Applicant: GLOBALFOUNDRIES Singapore Pte. Ltd., Singapore (SG)

(72) Inventors: Changqing Chen, Singapore (SG); Fransiscus X. G. Rivai, Singapore (SG); Choon Seng Adrian Ng, Singapore (SG); Kay Guan Chia, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 70 days.

(21) Appl. No.: 16/412,882

(22) Filed: May 15, 2019

(65) Prior Publication Data
US 2020/0363469 A1 Nov. 19, 2020

(51) Int. Cl.
*G01R 31/305* (2006.01)
*G01R 31/307* (2006.01)
*H01J 37/28* (2006.01)

(52) U.S. Cl.
CPC ............ *G01R 31/307* (2013.01); *H01J 37/28* (2013.01); *H01J 2237/2594* (2013.01); *H01J 2237/2813* (2013.01)

(58) Field of Classification Search
CPC .............. G01R 31/307; G01R 31/311; G01R 31/2656; G01R 31/28; G01R 31/26; G01R 31/308; G01R 31/2831; G01R 31/2648; G01R 13/04; G01R 13/38; G01R 1/071; G01R 1/08; G01N 21/956; G01N 21/9501; G01N 21/66; G01N 21/95
See application file for complete search history.

(56) References Cited

U.S. PATENT DOCUMENTS

| | | | |
|---|---|---|---|
| 5,150,043 A * | 9/1992 | Flesner | B82Y 15/00 324/750.14 |
| 5,430,305 A * | 7/1995 | Cole, Jr. | G01R 31/311 250/559.07 |
| 6,344,750 B1 * | 2/2002 | Lo | G01R 31/307 250/492.2 |
| 6,566,897 B2 | 5/2003 | Lo et al. | |
| 6,703,850 B2 * | 3/2004 | Nozoe | G01R 31/307 324/754.22 |
| 7,525,325 B1 | 4/2009 | Jenkins et al. | |
| 8,045,145 B1 * | 10/2011 | Bakker | G01N 21/95607 356/237.2 |
| 2014/0158885 A1 * | 6/2014 | Noji | H01J 37/05 250/307 |
| 2019/0232285 A1 * | 8/2019 | Yoo | F16K 99/004 |
| 2020/0266116 A1 * | 8/2020 | Saerchen | H01L 21/67288 |

* cited by examiner

*Primary Examiner* — Thang X Le
(74) *Attorney, Agent, or Firm* — Anthony Canale; Andrew M. Calderon; Roberts Calderon Safran & Cole, P.C.

(57) ABSTRACT

The present disclosure relates to a detection system, and, more particularly, to system for detection of passive voltage contrast and methods of use. The system includes a chamber; a stage provided within the chamber, configured to stage a target structure; an electron beam apparatus which is structured to emit an e-beam toward the stage; and a laser source which emits a laser signal toward the stage, at a same area as the e-beam.

17 Claims, 2 Drawing Sheets

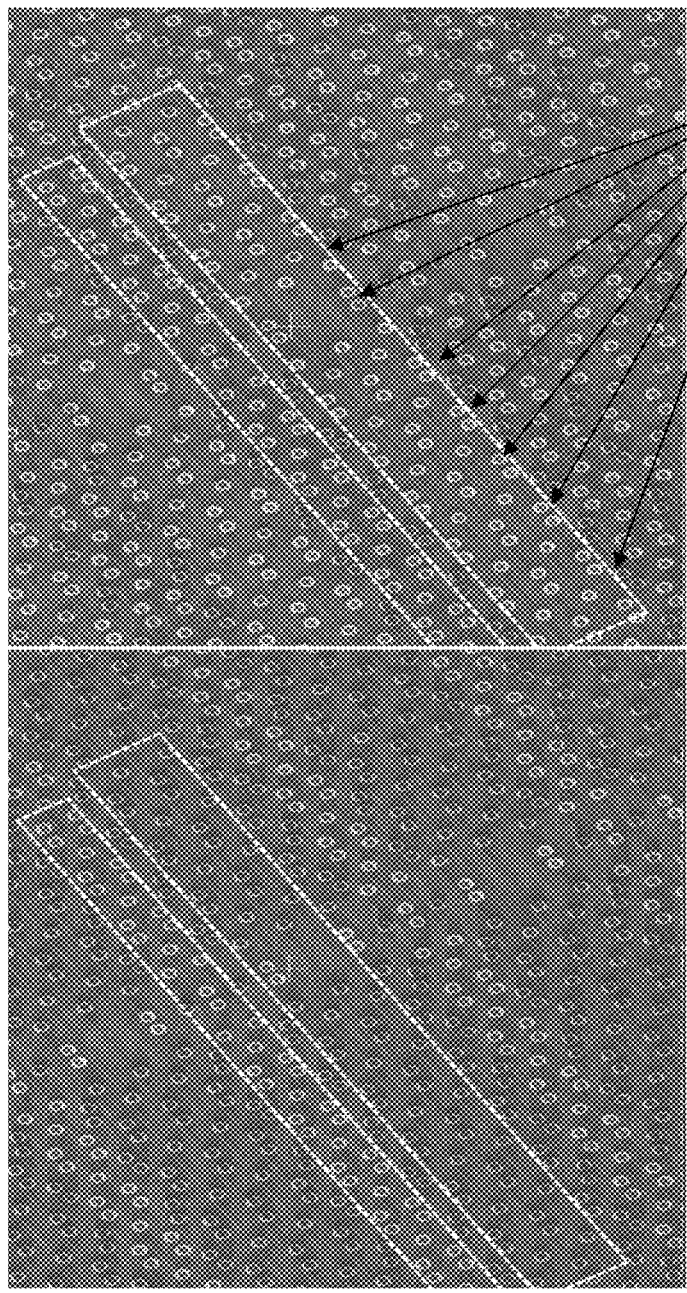

SYSTEM FOR DETECTION OF PASSIVE VOLTAGE CONTRAST

FIELD OF THE INVENTION

The present disclosure relates to a detection system, and, more particularly, to a system for detection of passive voltage contrast and methods of use.

BACKGROUND

Defect detection is important in the manufacture of semiconductor devices. For example, early detection enables a source of defects to be identified and eliminated before large numbers of wafers are affected. Passive voltage contrast (PVC) is a failure analysis used to detect defects and failure mechanisms in integrated circuits (IC). PVC is a pure passive voltage contrast, with no other energy source to trigger the structure besides the electron beam (e-beam); that is, a primary e-beam is the only source to induce sample surface potential difference and corresponding contrast.

In a known PVC method, a scanning electron microscope (SEM) is used to direct a beam of electrons onto the IC, which is located on a stage in a vacuum chamber, with a substrate on which the IC is formed being electrically grounded. The beam of electrons incident on the IC produces secondary electrons which can be detected to form a PVC image of the IC. Variations in local electric fields (voltage contrast) result in variations in image contrast and are responsible for certain areas of the IC such as gate oxide regions appearing relatively bright (i.e. light) in the PVC image when there is an electrical breakdown therein.

PVC is typically not performed on electrically-floating ICs such as ICs fabricated on SOI substrates. In order to apply the PVC method to SOI devices, the body, which is electrically isolated from the substrate, must be electrically grounded. But, electrically grounding the body of a SOI device while performing PVC analysis requires extensive pre-processing, which is time consuming and expensive. This pre-processing includes, for example, removing various layers of interconnect metallization from the top side of the SOI device. Then additional pre-processing is required to mechanically grind through the substrate from a bottom side thereof, followed by etching through the insulator layer to expose a portion of the body. Once the body is exposed, it is then necessary to apply an electrically conductive coating over the exposed portion of the body, insulator layer and substrate to form an electrical connection between the body and the electrically grounded substrate.

SUMMARY

In an aspect of the disclosure, a system comprises: a chamber; a stage provided within the chamber, configured to stage a target structure; an electron beam apparatus which emits an e-beam toward the stage; and a laser source which is structured to emit a laser signal toward the stage, at a same area as the e-beam.

In an aspect of the disclosure, a system comprises: a scanning electron microscope (SEM) chamber; an electron beam apparatus which emits an e-beam within the SEM chamber; a laser source which is structured to provide additional energy in the SEM chamber to enhance an amount of electrons collected while the electron beam apparatus scans across a surface of a target to thereby increase contrast between a defect site and its surroundings; and a manipulator which is structured to manipulate the laser source.

In an aspect of the disclosure, a system comprises: a scanning electron microscope (SEM) chamber; a stage provided within the SEM chamber and which is structured to hold a target; an adjustable electron beam apparatus which emits an e-beam within the SEM chamber and toward a surface of the target; a laser source located externally from the SEM chamber and which includes a fiber within the SEM chamber, the fiber focuses energy onto the target within the SEM chamber; a manipulator which is structured to manipulate the fiber to focus the energy on a surface of the target in a same position as the e-beam; and a detector within the SEM chamber which detects a contrast of the target as the energy and e-beam focus on the surface of the target.

BRIEF DESCRIPTION OF THE DRAWINGS

The present disclosure is described in the detailed description which follows, in reference to the noted plurality of drawings by way of non-limiting examples of exemplary embodiments of the present disclosure.

FIGS. 3A and 3B show comparison pictures of a same sample (target) in a same location using a conventional system and the contrasting imaging system shown in FIG. 1.

DETAILED DESCRIPTION

The present disclosure relates to a detection system, and, more particularly, to system for detection of passive voltage contrast (PVC) and methods of use. More specifically, the present disclosure relates to a contrasting imaging system for detection of passive voltage contrast by laser assistance and methods for detecting the same. In embodiments, the system includes a laser incorporated in a Scanning Electron Microscope (SEM) and a method of using the laser for performing a measurement/analysis/testing (e.g., defect analysis) on a semiconductor substrate, e.g., using the laser signal to enhance a voltage contrast signal in the SEM. Advantageously, the present disclosure enhances the PVC capability by improving contrast in a signal thereby improving measurement (defect) readings.

In embodiments, a laser source in a SEM chamber provides a passive measurement technique where the integrated circuit (IC) is not addressed electrically. For example, in implementing the system described herein, a laser source (signal) provides additional energy in a SEM to enhance the amount of electrons collected while the electron beam scans across the surface of a target. In this way, it is possible to increase contrast between a defect site and its surroundings.

The laser source can be an externally controllable laser coupled to the chamber of the SEM. For example, the laser position can be controlled by a manipulator such that the laser can be directed to shine or focus on a target (IC), itself. A photovoltaic effect will occur at the area of the laser such that the primary e-beam in the SEM chamber and the and photovoltaic effect will both take effect at a same time to generate an improved image contrast. Advantageously, the use of the laser source in the SEM chamber can be used to detect defects on an SOI device, without the need for pre-processing activities as already described herein.

Figure 1:
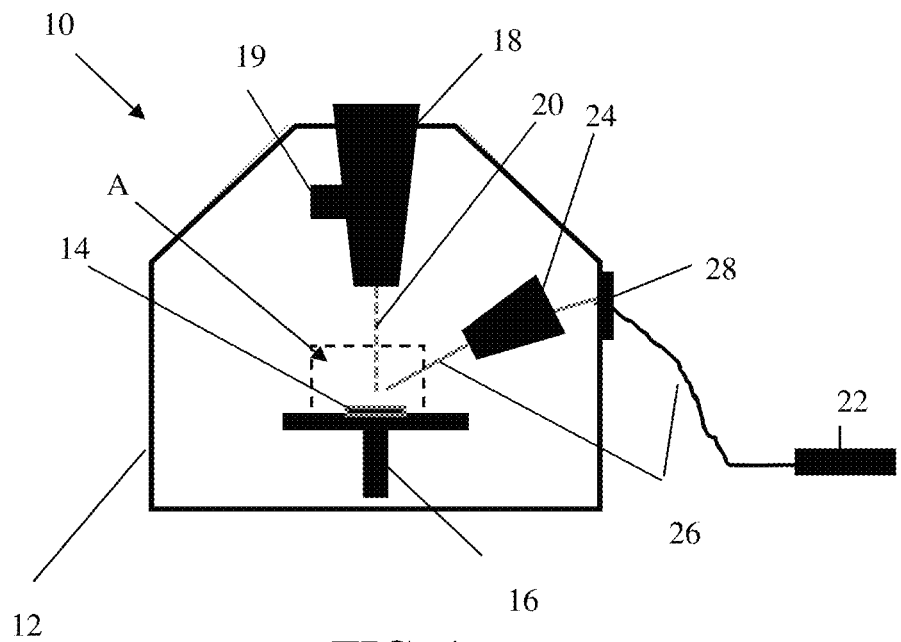
FIG. 1 shows a contrasting imaging system with a laser source, amongst other features, in accordance with aspects of the present disclosure.

FIG. 1 shows a contrasting imaging system with a laser source, amongst other features, in accordance with aspects of the present disclosure. In embodiments, the system 10 includes a chamber 12, e.g., SEM chamber, which houses a structure 14, e.g., target, for PVC inspection and imaging, i.e., defect analysis. The chamber 12 can be a vacuum chamber, as an illustrative example.

In embodiments, the structure 14 is mounted (electrically grounded) on a stage (e.g., table) 16 within the chamber 12. The stage 16 can be a movable (e.g., adjustable) stage in the x, y and z directions, such that the target 14 can be positioned underneath an SEM column 18. The target 14 can be a semiconductor device including, for example, SOI products. As should be understood by those of ordinary skill in the art, the SEM column 18 emits a primary electron beam (e-beam) 20 onto the target 14. The SEM column 18 can also include a detector 19 which is capable of detecting different contrasts caught for different types of contacts/structures on the target 14, based on the reflections of the primary e-beam 20. In alternative embodiments, the detector 19 can be positioned at other locations within the chamber 12.

Still referring to FIG. 1, the chamber 12 includes an externally controllable laser source 22 coupled to the chamber 12. The laser position (e.g., fiber optic 26 within the chamber 12) can be controlled by a manipulator 24 inside the SEM chamber 12 in order that the laser can be emitted onto a specific target area of the target 14. In an illustrative example, the manipulator 24 can be a piezo-controlled manipulator or other manipulator capable of focusing (adjusting) the laser source 22 onto the target area of the target 14. In alternative embodiments, the controllable laser source 22 can also be placed within the chamber 12, itself. (This alternative placement can be represented by reference numeral 26.)

In embodiments, the laser source 22 has an energy higher than the bandgap of the target 14. For example, the laser source 22 can be 650 nm laser, transmitted into the SEM chamber 12 by the optical fiber 26 and controlled by the manipulator 24 to target a relevant area on the target 14. In this way, the laser source 22 can excite free electrons to generate a photovoltaic effect on the target area of the target 14. The photovoltaic effect can take effect at the same time with the primary e-beam 20 to generate the image contrast, detected by the detector 19, i.e., the detector 19 will detect the passive voltage contrast with laser assistance. In embodiments, the photovoltaic effect can be applied by coupling light into the SEM chamber, with the surface potential being built-up on the target 14 by the photovoltaic effect before the e-beam 20 shines on the target area of the target 14.

Figure 2:
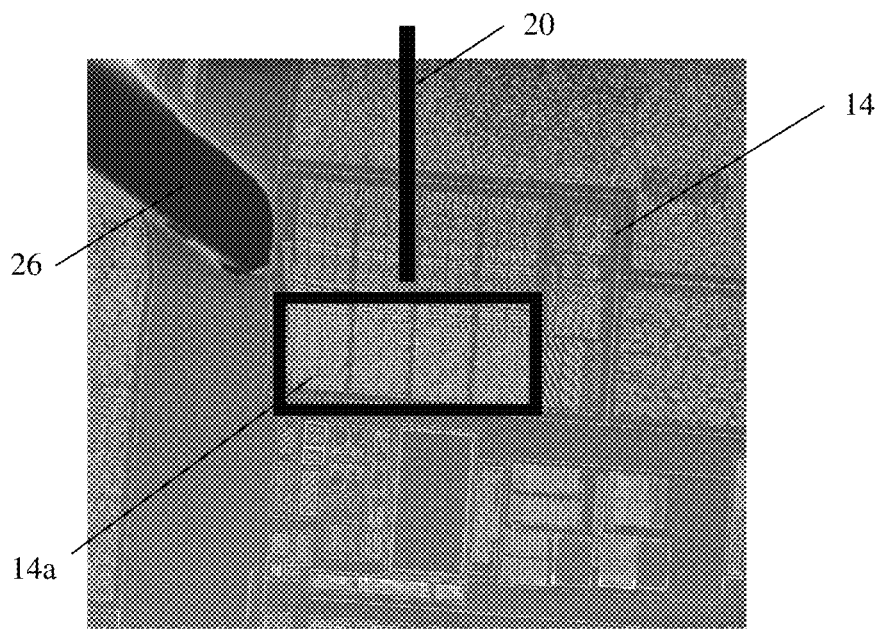
FIG. 2 shows an enlarged view of a target area using the contrasting imaging system of FIG. 1

FIG. 2 shows an enlarged view of a target area 14a of the target 14 as shown in box A of FIG. 1. As shown in FIG. 2, both the laser source (e.g., fiber optic 26 within the chamber 12) and the e-beam 20 of the SEM column 18 are focused on a target area 14a of the target 14. As described herein, the laser source (e.g., fiber optic 26 within the chamber 12) and/or the e-beam 20 can be manipulated to focus energy (light) directly on a desired area of the target 14.

FIGS. 3A and 3B show comparison pictures (images) of a same sample (target) in a same location using a known PVC system and the system shown in FIG. 1. For example, FIG. 3A shows a contrast image of a target area without a laser source; whereas, FIG. 3B shows a contrast image of the same target area with the laser source as described with respect to FIG. 1. As can be easily discerned by these images, the image shown in FIG. 3B includes better defined features 29, compared to that shown in FIG. 3A. That is, when the laser was emitted on the target, an improved contrast image can be observed, compared to the PVC of FIG. 3A.

Accordingly, the design described herein integrates a laser source to induce surface potential difference by the photovoltaic effect. Combined with the photovoltaic effect, the e-beam can generate different contrast compared to known PVC (e-beam alone). This contrast using the laser source is useful in the defect localization. Also, with the photovoltaic effect generated potential, PVC on SOI also becomes feasible.

The systems and method(s) as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A system, comprising:
    a chamber;
    a stage movable in an x, y and z direction, the stage being provided within the chamber and configured to stage a target structure;
    an electron beam apparatus which emits an electronic beam (e-beam) toward the stage;
    a laser source structured to emit a laser signal toward the movable stage, at a same area as the e-beam, such that the laser signal provides energy in the chamber to enhance an amount of electrons collected as the e-beam scans across a surface of the target structure; and
    a detector within the chamber, the detector being configured to detect passive voltage contrast in the target structure as reflections of the e-beam as enhanced by the laser signal.

2. The system of claim 1, wherein the chamber is a vacuum chamber.

3. The system of claim 1, wherein the chamber is a Scanning Electron Microscope (SEM) and the laser signal enhances a voltage contrast signal in the SEM.

4. The system of claim 1, further comprising a manipulator that manipulates the laser source.

5. The system of claim 4, wherein the manipulator is a piezo-controlled manipulator.

6. The system of claim 1, wherein the laser source is within the chamber.

7. The system of claim 1, wherein the laser source is a 650 nm laser.

8. The system of claim 1, wherein the laser source has an energy higher than a bandgap of the target structure.

9. The system of claim 1, wherein both the laser source and the electron beam apparatus are adjustable within the chamber.

10. A system comprising:
a scanning electron microscope (SEM) chamber;
an electron beam apparatus which emits electronic beam (e-beam) within the SEM chamber;
a laser source which is structured to provide additional energy in the SEM chamber to enhance an amount of electrons collected while the electron beam apparatus scans across a surface of a target to thereby increase contrast between a defect site and its surroundings;
a manipulator which is structured to manipulate the laser source; and
a detector within the SEM chamber, which is configured to detect passive voltage contrast in the target as reflections from the electron beam apparatus and the laser source.

11. The system of claim 10, wherein the laser source is structured to enhance a voltage contrast signal in the SEM chamber.

12. The system of claim 10, wherein the manipulator is a piezo-controlled manipulator.

13. The system of claim 10, wherein the laser source is a 650 nm laser.

14. The system of claim 10, wherein the laser source has an energy higher than a bandgap of the target.

15. The system of claim 10, wherein both the laser source and the electron beam apparatus are adjustable within the chamber.

16. A system comprising:
a scanning electron microscope (SEM) chamber;
a stage provided within the SEM chamber and which is structured to be movable in x, y and x directions, and to hold a target;
an adjustable electron beam apparatus which emits an electronic beam (e-beam) within the SEM chamber toward a surface of the target;
a laser source located externally from the SEM chamber and which includes a fiber within the SEM chamber, the fiber focuses energy onto the target within the SEM chamber at a same location as the e-beam;
a manipulator which is structured to manipulate the fiber to focus the energy on a surface of the target in a same position as the e-beam; and
a detector within the SEM chamber which detects a passive voltage contrast of the target as the energy and e-beam focus on the surface of the target.

17. The system of claim 16, wherein the manipulator is a piezo-controlled manipulator and the energy is a laser that has an energy higher than a bandgap of the target.

\* \* \* \* \*